United States Patent
Hashimoto et al.

(10) Patent No.: US 11,456,168 B2
(45) Date of Patent: Sep. 27, 2022

(54) METHOD OF LAPPING SEMICONDUCTOR WAFER AND SEMICONDUCTOR WAFER

(71) Applicant: SUMCO CORPORATION, Tokyo (JP)

(72) Inventors: Daisuke Hashimoto, Tokyo (JP);
Satoshi Matagawa, Tokyo (JP);
Tomohiro Hashii, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 285 days.

(21) Appl. No.: 16/324,291

(22) PCT Filed: May 1, 2017

(86) PCT No.: PCT/JP2017/017201
§ 371 (c)(1),
(2) Date: Feb. 8, 2019

(87) PCT Pub. No.: WO2018/042761
PCT Pub. Date: Mar. 8, 2018

(65) Prior Publication Data
US 2019/0181001 A1 Jun. 13, 2019

(30) Foreign Application Priority Data
Aug. 31, 2016 (JP) .............................. JP2016-169383

(51) Int. Cl.
*B24B 37/08* (2012.01)
*B24B 37/28* (2012.01)
(Continued)

(52) U.S. Cl.
CPC ...... *H01L 21/02013* (2013.01); *B24B 37/042* (2013.01); *B24B 37/08* (2013.01);
(Continued)

(58) Field of Classification Search
CPC ....... B24B 37/042; B24B 37/08; B24B 37/28; H01L 21/02013; H01L 21/304; H01L 29/16; H01L 29/34
(Continued)

(56) References Cited

U.S. PATENT DOCUMENTS

| | | | |
|---|---|---|---|
| 5,914,053 | A | 5/1999 | Masumura et al. |
| 7,601,644 | B2 | 10/2009 | Koyata et al. |

(Continued)

FOREIGN PATENT DOCUMENTS

| | | |
|---|---|---|
| JP | H09-150366 A | 6/1997 |
| JP | 2001-260015 A | 9/2001 |

(Continued)

OTHER PUBLICATIONS

Machine Translation, Taniguchi et al., JP 2010-010358, Jan. 2010. (Year: 2010).*

(Continued)

*Primary Examiner* — Eileen P Morgan
(74) *Attorney, Agent, or Firm* — Greenblum & Bernstein, P.L.C.

(57) ABSTRACT

Provided is a method of lapping a semiconductor wafer, which can suppress the formation of a ring-shaped pattern in a nanotopography map. The method of lapping a semiconductor wafer includes: a stopping step of stopping lapping of a semiconductor wafer; a reversing step of reversing surfaces of the semiconductor wafer facing a upper plate and a lower plate after the stopping step; and a resuming step of resuming lapping of the semiconductor wafer after the reversing step while maintaining the reversal of the surfaces facing the plates.

5 Claims, 7 Drawing Sheets

(51) Int. Cl.
    *H01L 21/02*    (2006.01)
    *H01L 21/304*   (2006.01)
    *B24B 37/04*    (2012.01)
    *H01L 29/16*    (2006.01)
    *H01L 29/34*    (2006.01)

(52) U.S. Cl.
    CPC ............ *B24B 37/28* (2013.01); *H01L 21/304* (2013.01); *H01L 29/16* (2013.01); *H01L 29/34* (2013.01)

(58) Field of Classification Search
    USPC ................ 451/41, 261, 262, 268, 269, 271
    See application file for complete search history.

(56) References Cited

U.S. PATENT DOCUMENTS

| | | | | |
|---|---|---|---|---|
| 2005/0124264 A1* | 6/2005 | Tominaga | ............... | B24B 37/08 451/41 |
| 2008/0113510 A1* | 5/2008 | Kato | ............... | B24B 9/065 438/691 |
| 2010/0144249 A1* | 6/2010 | Kitagawa | ............... | B24B 37/015 451/65 |
| 2010/0330881 A1* | 12/2010 | Schwandner | ............... | B24B 7/228 451/41 |
| 2014/0320867 A1* | 10/2014 | Kanno | ............... | B24B 37/013 356/630 |
| 2017/0355060 A1* | 12/2017 | Park | ............... | B24B 37/013 |

FOREIGN PATENT DOCUMENTS

| | | |
|---|---|---|
| JP | 2002-280332 A | 9/2002 |
| JP | 2004-314192 A | 11/2004 |
| JP | 2006-100799 A | 4/2006 |
| JP | 2010-010358 A | 1/2010 |
| JP | 2011-009735 A | 1/2011 |
| JP | 2013-078826 A | 5/2013 |
| KR | 2010-0099991 A | 9/2010 |

OTHER PUBLICATIONS

Google search for definition of Lapping. Apr. 22, 2021.*
Notification of Reasons for Refusal issued in Japanese family member Patent Appl. No. 2016-169383, dated Jul. 25, 2017, together with an English-language translation.
Notification of Reasons for Refusal issued in Japanese family member Patent Appl. No. 2016-169383, dated Nov. 7, 2017, together with an English-language translation.
International Search Report issued in International Bureau of WIPO Patent Application No. PCT/JP2017/017201, dated Jul. 11, 2017, together with an English-language translation.
International Preliminary Report on Patentability issued in World Intellectual Property Organization Patent Application No. PCT/JP2017/017201, dated Mar. 5, 2019, along with an English translation thereof.
Notification of Reason for Refusal (Office Action) for Korean Patent Application No. 10-2018-7035078, dated Feb. 7, 2020; and English-language translation thereof.
Office Action for KR App. No. 10-2018-7035078, dated Oct. 14, 2020 (w/ translation).
Office Action for DE App. No. 11 2017 004 349.2, dated Feb. 18, 2022 (w/ translation).

* cited by examiner

METHOD OF LAPPING SEMICONDUCTOR WAFER AND SEMICONDUCTOR WAFER

TECHNICAL FIELD

This disclosure relates to a method of lapping a semiconductor water and a semiconductor wafer.

BACKGROUND

Silicon wafers and compound semiconductor wafers of GaAs etc. are known as semiconductor wafers. Semiconductor wafers are typically obtained by performing a slicing step of slicing a single crystal ingot into thin disk-shaped wafers using a wire saw, a lapping step of making the sliced wafer have flat front and back surfaces and a predetermined thickness, and a polishing step of performing mirror polishing for eliminating irregularities on the surfaces of the wafer after the lapping to achieve high flatness. Note that a double-disc grinding step of mechanical grinding may be performed instead of or in addition to the lapping step.

In recent years, in particular for large diameter semiconductor wafers, "nanotopography" which is a parameter of undulating components on a surface of a wafer (SEMI Standard M43) has been given importance. Nanotopography refers to indications of irregularities observed on a surface of a semiconductor wafer having spatial wavelength components of approximately 0.2 mm to 20 mm, and is expressed using the height difference in an area of a predetermined size. The nanotopographies of a semiconductor wafer are obtained by optical measurements using optical interferometry in a state where the semiconductor wafer has been mirror polished. Undulations caused due to machining for example in the slicing step, lapping step, and double-disc grinding step described above are considered to possibly deteriorate the nanotopographies of the semiconductor wafer.

Here, a typical process of lapping a semiconductor wafer according to conventional techniques will be described with reference to FIG. 1. As schematically illustrated in FIG. 1, a semiconductor wafer W is loaded in a retainer opening 20a of each carrier plate 20. The carrier plates 20 are placed between an upper plate 10A and a lower plate 10B which are placed to face each other and rotated in opposite directions. The shapes of gears are not shown in the drawing for brevity; an external gear 20b of each carrier plate is meshed with a sun gear 11 and an internal gear 12. Due to the mesh of the gears, when the lower plate 10B is rotated, while each carrier plate 20 revolves about the sun gear 11, the carrier plate 20 itself is rotated, thus planetary motion is achieved. Further, while a solution containing abrasive grains (not shown) is supplied, the semiconductor wafers W are pressed by the upper plate 10A and the lower plate 10B, thus the front and back surfaces of the semiconductor wafers W are lapped. Note that the lapping is usually terminated after performing lapping for a predetermined time or after confirming the removal of a target amount of material by lapping is achieved for example by measuring the thickness of the semiconductor wafer.

For example, JP 2001-260015 (PTL 1) discloses a method of lapping a semiconductor wafer, including: a step of preparing a carrier plate having a thickness approximately the same as a predetermined thickness of a lapped semiconductor wafer and a step of terminating a lapping of the semiconductor wafer when a contact of the upper plate and the carrier plate is detected. The lapping method disclosed in PTL 1 can increase the flatness of (i.e., further flatten) a semiconductor wafer having been lapped.

CITATION LIST

Patent Literature

PTL 1: JP 2001-260015 A

SUMMARY

Technical Problem

In evaluating a nanotopography map obtained by mapping the nanotopographies of a surface of a silicon wafer prepared by slicing, lapping, and polishing, the inventors of this disclosure confirmed that a ring-shaped pattern was observed in the periphery of the silicon wafer (see FIG. 2A). The nanotopography map presented in FIG. 2A was obtained using WaferSight 3 manufactured by KLA-Tencor Corporation. In the nanotopography map in FIG. 2A, light areas correspond to raised areas and dark areas correspond to recessed areas. In the example of FIG. 2A, a ring-shaped recessed pattern is observed in the periphery of approximately 20 mm to 30 mm from the wafer edge to the wafer center. A schematic cross-sectional view of a silicon wafer corresponding to the nanotopography map presented in FIG. 2A is depicted in FIG. 2B. On the other hand, the inventors found that there were cases where a ring-shaped raised pattern was observed in the periphery of a similar area in a nanotopography map in contrast to the example of FIG. 2A.

The inventors diligently studied to find the cause of the formation of such a ring pattern in a nanotopography map. As a result, the geometric profile of a semiconductor wafer having been lapped was found to have a strong correlation with the profile of the nanotopographies of the wafer having been polished after the lapping. The inventors focused on this fact. They studied the machining effects of lapping on the nanotopography profile. Note that the geometric profile of a semiconductor wafer herein refers to the height profile of the central position in the thickness of the semiconductor wafer in the radial direction of the semiconductor wafer (silicon wafer) (a broken line in FIG. 2B) with respect to a reference plane as illustrated in FIG. 2. In the example of FIG. 2B, the semiconductor wafer is warped upward in a direction such that the center of the wafer is raised as a whole; however, the thickness of the semiconductor wafer in the radial direction is constant. Inflection points are found near the edges of the semiconductor wafer in the geometric profile of the semiconductor wafer.

Here, FIG. 3A to FIG. 4B are schematic views illustrating the arrangement of the plates, carrier plates, and semiconductor wafers in lapping of the lapping method described with reference to FIG. 1. FIGS. 3A and 3B are schematic views of a state where the semiconductor wafers W are farthest from the center of the plates (the upper plate 10A and the lower plate 10B), and FIGS. 4A and 4B are schematic views of a state where the semiconductor wafers W are closest to the center of the plates (the upper plate 10A and the lower plate 10B). Note that FIG. 3A and FIG. 4A are top views in which the upper plate is imaginarily removed. FIG. 3B is a cross-sectional view corresponding to FIG. 3A taken along line I-I, and FIG. 4B is a cross-sectional view corresponding to FIG. 4A taken along line II-II.

The upper plate 10A and the lower plate 10B are originally flat when installed in a lapping apparatus. However, the inventors found that after lapping of semiconductor wafers is repeated, the shapes of the upper plate 10A and the lower plate 10B were deformed. The shapes of the upper plate 10A and the lower plate 10B having been deformed are schematically depicted in FIG. 3B and FIG. 4B. For the upper plate 10A, in the radial cross-sectional view thereof, a center portion between the sun gear 11 side and the internal gear 12 side (see also FIG. 1) has a recessed shape, and locally raised areas are formed on both the sun gear 11 side and the internal gear 12 side. In contrast to the upper plate 10A, for the lower plate 10B, in the cross-sectional view thereof, a center portion between the sun gear 11 side and the internal gear 12 side has a raised shape, and recessed areas are formed on both the sun gear 11 side and the internal gear 12 side. The irregularities of the upper plate 10A and the lower plate 10B substantially fit to each other.

The upper plate 10A and the lower plate 10B are deformed into shapes as schematically depicted in FIG. 3B and FIG. 4B. Accordingly, as illustrated in FIG. 3B, when the semiconductor wafers W are distant from the center of the plates (i.e., when the wafers are closer to the internal gear), while relatively strong pressing force $F_S$ is applied to portions of the plates on the internal gear 12 side, relatively weak pressing force $F_W$ is applied to portions of the plates on the sun gear 11 side. Further, as illustrated in FIG. 4B, when the semiconductor wafers W are closer to the center of the plates (i.e., when the wafers are closer to the sun gear), relatively weak pressing force $F_W$ is applied to portions of the plates on the internal gear 12 side, relatively strong pressing force $F_S$ is applied to portions of the plates on the sun gear 11 side.

In lapping, such biased pressing forces are applied to the semiconductor wafers. Therefore, undulations caused due to machining are left on the semiconductor wafer surfaces, and the undulations cannot be sufficiently removed even by the subsequent polishing step. The inventors considered that this led to the ring-shaped raised pattern or the recessed pattern observed when the nanotopography map was obtained. In conventional techniques, undulations caused due to machining by lapping have been assumed to be sufficiently eliminated by a polishing step performed after a lapping step. However, in recent years, nanotopography quality is attracting attention, and there will be increasing demand for semiconductor wafers for which neither of a ring-shaped recessed pattern nor raised pattern is observed in the evaluation using a nanotopography map.

Given these circumstances, it could be helpful to provide a method of lapping a semiconductor wafer, which can suppress the formation of a ring-shaped pattern in a nanotopography map.

Solution to Problem

With a view to achieving the above objective, the inventors made intensive studies. The inventors contemplated reversing the surfaces of semiconductor wafers facing the plates while temporarily stopping lapping in order to reduce undulations caused due to the shape of the plates. The inventors thus found that in semiconductor wafers subjected to such reversal, the formation of a ring-shaped pattern in a nanotopography map after polishing could be suppressed. This discovery led to this disclosure.

Specifically, we propose the following features.

(1) A method of lapping a semiconductor wafer, in which while a solution containing abrasive grains is supplied to a gap between an upper plate and an lower plate placed to face each other, a carrier plate on which a semiconductor wafer is loaded is made to perform planetary motion, thereby lapping a front surface and a back surface of the semiconductor wafer, includes:

a starting step of starting lapping of the semiconductor wafer;

a stopping step of stopping lapping of the semiconductor wafer;

a reversing step of reversing surfaces of the semiconductor wafer facing the upper plate and the lower plate after the stopping step; and a resuming step of resuming lapping of the semiconductor wafer after the reversing step while maintaining the reversal of the surfaces facing the plates.

(2) The method of lapping a semiconductor wafer, according to (1) above, wherein the reversing step is performed when a lapping amount is 40% or more and 60% or less with respect to a target lapping amount.

(3) The method of lapping a semiconductor wafer, according to (1) or (2) above, wherein the semiconductor wafer is a silicon wafer.

(4) A mirror polished semiconductor wafer, for which neither of a ring-shaped recessed pattern nor a ring-shaped raised pattern is observed on a surface of the semiconductor wafer by nanotopography map evaluation.

The term "nanotopography map evaluation" herein refers to evaluation of whether a ring-shaped recessed pattern or raised pattern is observed in the periphery of a semiconductor wafer in a nanotopography map obtained by measuring the height profile (height difference) of a mirror polished surface of the semiconductor wafer with the use of a flatness measurement system using optical interferometry (Wafer-Sight 3 manufactured by KLA-Tencor Corporation). Specifically, long wavelength components are removed by filtering using a double Gaussian filter with a cut-off wavelength of 20 mm from a measurement result of the height of a semiconductor wafer having been mirror polished, and whether a ring-shaped pattern is formed is then determined from a nanotopography map in which the measurement results of nanotopography are graphically expressed in light and shade. In this nanotopography map, darker colors indicate lower heights and the darkest portion corresponds to −20 nm from the center height, whereas the lighter colors correspond to higher heights, and the lightest portion corresponds to +20 nm from the center height. Accordingly, the height difference between the lowest height and the highest height is 40 nm. Note that when the nanotopography map is to be obtained, the front and back surfaces of the semiconductor wafer are hold to be vertical surfaces and three given points in the periphery of the semiconductor wafer are fixed to measure the semiconductor wafer surfaces. Accordingly, the nanotopography map depicts the height difference of a surface of a semiconductor wafer which is not held by suction. In particular, in a cross section of a nanotopography map, no ring pattern is observed when the difference between the average height of a surface center area of a semiconductor wafer and the average height of a surface peripheral area of the semiconductor wafer, which surrounds the surface center area is 1 nm or less.

(5) The semiconductor wafer according to above, wherein a diameter of the semiconductor wafer is 300 mm or more.

(6) The semiconductor wafer according to (4) or (5) above, wherein the semiconductor wafer is a silicon wafer.

Advantageous Effect

This disclosure provides a method of lapping a semiconductor wafer, which can suppress the formation of a ring-shaped pattern in a nanotopography map.

BRIEF DESCRIPTION OF THE DRAWINGS

In the accompanying drawings:

FIGS. 3A and 3B are schematic views illustrating the arrangement of upper and lower plates, carrier plates, and semiconductor wafers when the semiconductor wafers are lapped, which arrangement has been studied by the inventors, in which FIG. 3A is a top view and FIG. 3B is a cross-sectional view thereof taken along line I-I;

FIGS. 4A and 4B are schematic views illustrating the arrangement of upper and lower plates, carrier plates, and semiconductor wafers when the semiconductor wafers are lapped, which arrangement has been studied by the inventors, in which FIG. 4A is a top view and FIG. 4B is a cross-sectional view thereof taken along line II-II;

DETAILED DESCRIPTION

Figure 1:
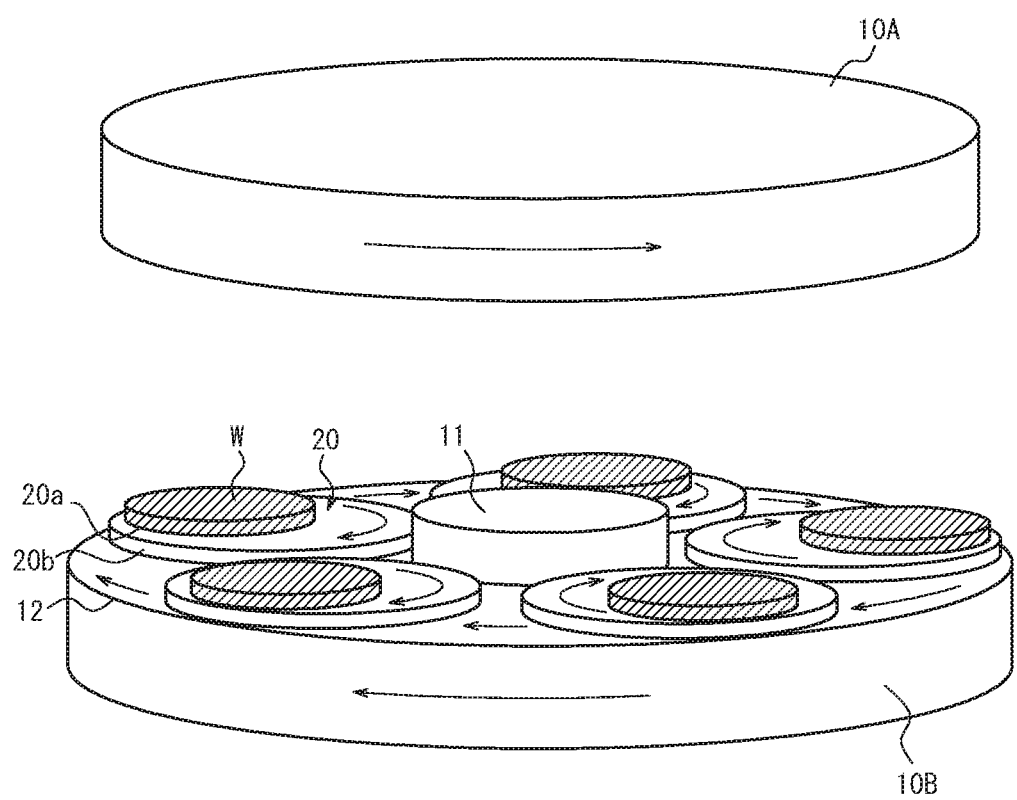
FIG. 1 is a schematic view illustrating a method of lapping a semiconductor wafer in accordance with conventional techniques.
Figure 2A:
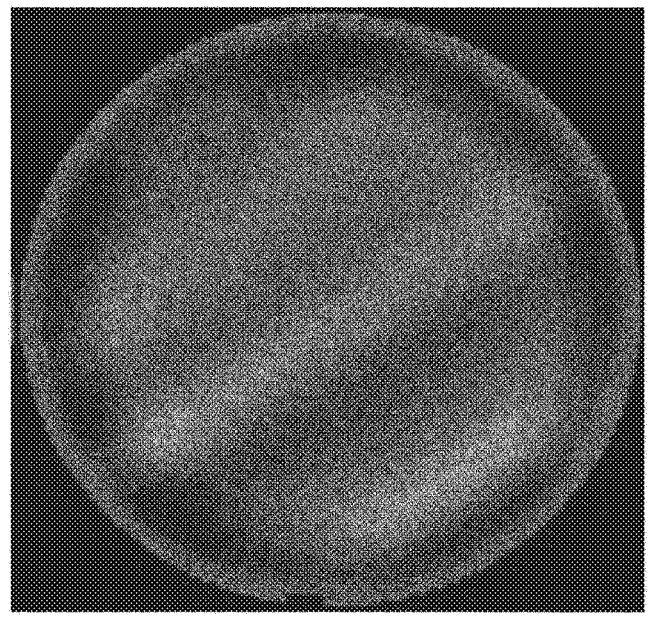
FIG. 2A is a diagram illustrating an example of a nanotopography map of a silicon wafer observed by the inventors.
Figure 2B:
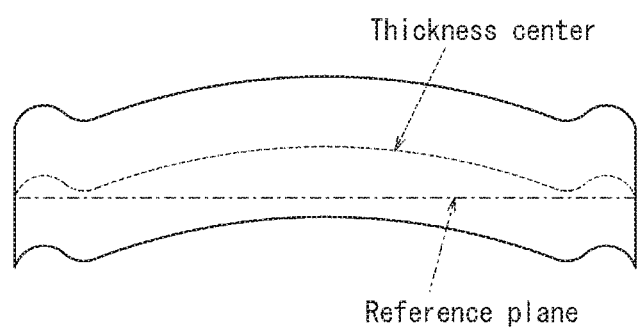
FIG. 2B is a schematic cross-sectional view corresponding to the nanotopography map presented in FIG. 2A, taken in the radial direction of the silicon wafer.
Figure 3A:
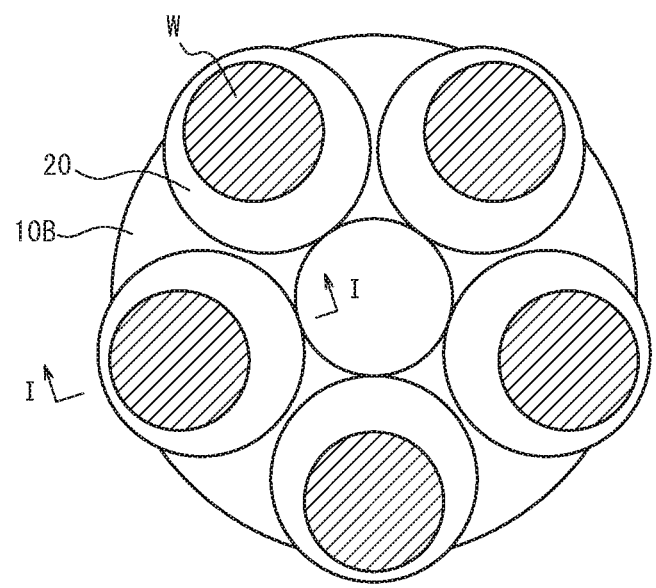
Figure 3B:
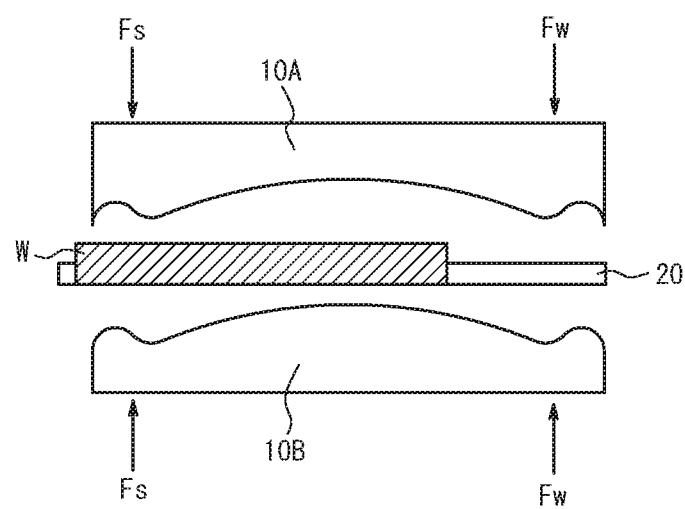
Figure 4A:
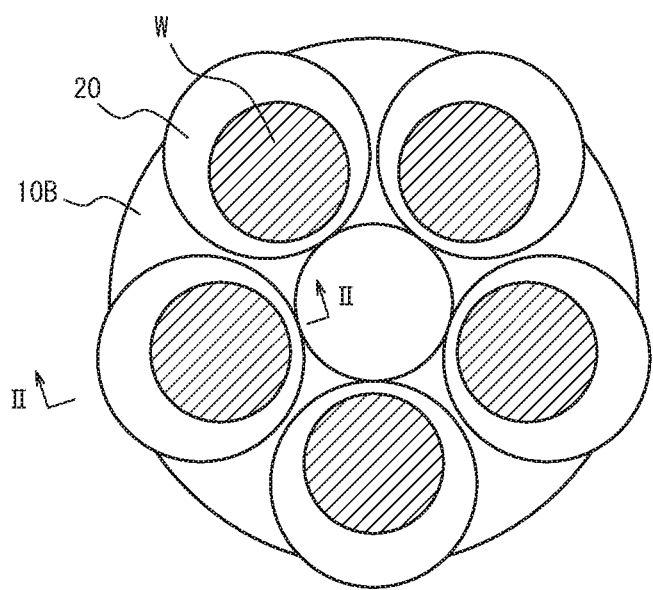
Figure 4B:
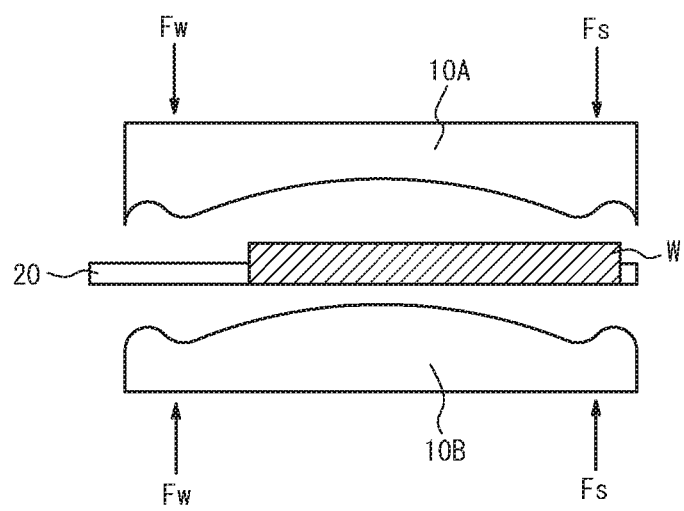

A method of lapping a semiconductor water according to one embodiment of this disclosure will now be described with reference to the drawings. Note that the thickness of each component in the drawings is exaggerated for convenience of description, and the thickness ratio of the illustrated components does not conform to the actual thickness ratio.

(Method of Lapping Semiconductor Wafer)

Figure 5:
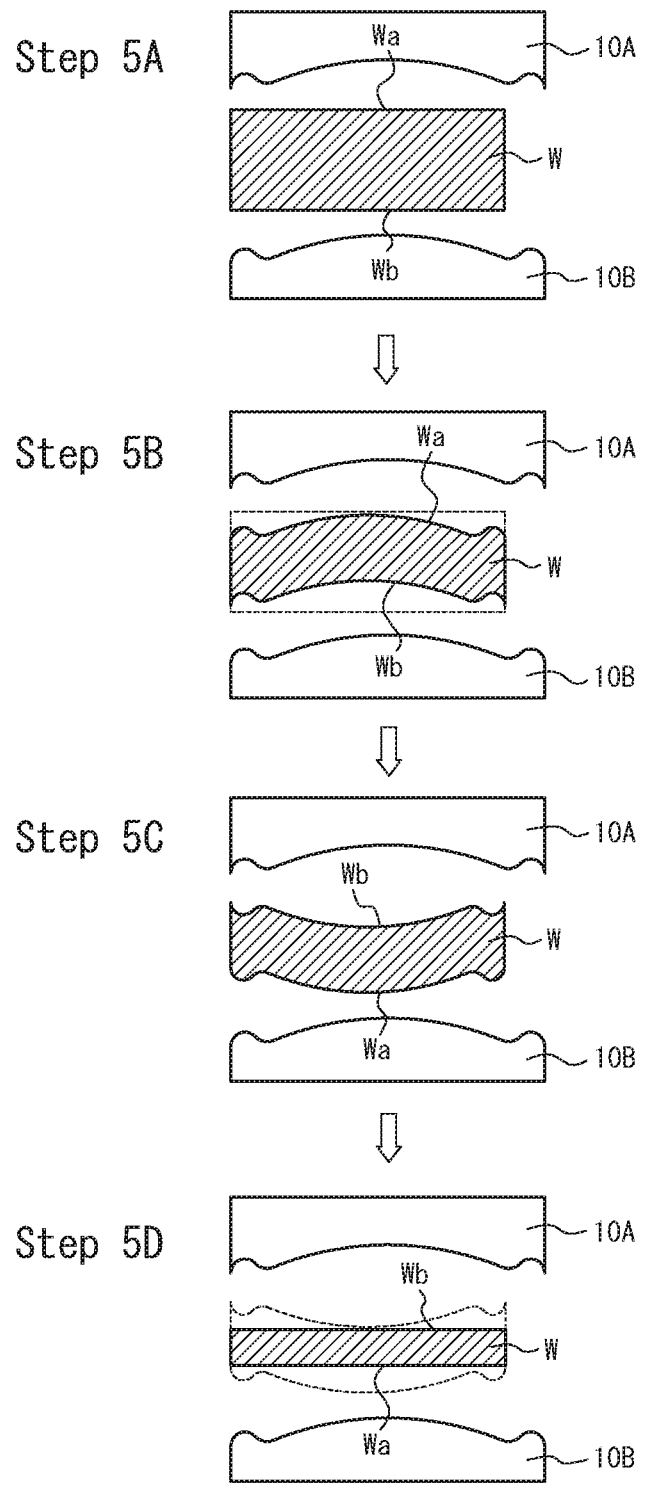
FIG. 5 is a process flow diagram illustrating a method of lapping a semiconductor wafer according to one embodiment of this disclosure.

In a method of lapping a semiconductor wafer according to one embodiment of this disclosure, as schematically illustrated in FIG. 1, while a solution containing abrasive grains (not shown) is supplied to a gap between the upper plate 10A and the lower plate 103 placed to face each other, the carrier plates 20 on which the semiconductor wafers W are loaded are made to perform planetary motion thereby lapping the front and back surfaces of each semiconductor wafer W. Further, as illustrated in FIG. 5, the method of lapping a semiconductor wafer according to this embodiment includes a starting step of starting lapping of the semiconductor wafer W (Step 5A of FIG. 5); a stopping step of stopping lapping of the semiconductor wafer W (Step 5B of FIG. 5); a reversing step of reversing surfaces of the semiconductor wafer W facing the upper plate 10A and the lower plate 103 after the stopping step (Step 5C of FIG. 5); and a resuming step of resuming lapping of the semiconductor wafer W after the reversing step as the reversal of the surfaces facing the plates is maintained (Step 5D of FIG. 5). Thus, the formation of a ring-shaped pattern in a nanotopography map can be suppressed. Note that FIG. 5 only depicts the upper plate 10A, the lower plate 10B, and the semiconductor wafer W in the above steps. These steps will be sequentially described in detail below.

First, the starting step of starting lapping of the semiconductor wafer W (Step 5A of FIG. 5) is performed. In this starting step, as schematically illustrated in FIG. 1, the semiconductor wafer W is loaded in the retainer opening 20a of each carrier plate 20 as in the conventional techniques. The carrier plates 20 on which the semiconductor wafers W are loaded are placed between the upper plate 10A and the lower plate 10B which are placed to face each other. The upper plate 10A and the lower plate 10B are rotated in opposite directions, and when the external gear 20b of the carrier plate is meshed with the sun gear 11 and the internal gear 12, while the carrier plate 20 revolves about the center of the carrier plate 20 (hereinafter referred to as "revolution"), the carrier plate 20 is rotated about the center of the upper plate 10A and the lower plate 10B around the sun gear 11 (hereinafter referred to as "rotation"). Such revolution and rotation motion of the carrier plate 20 is referred to as planetary motion. In this step, while the carrier plate 20 itself is made to perform planetary motion, a solution containing abrasive grains (not shown) is supplied, and the semiconductor wafer W is pressed by the upper plate 10A and the lower plate 10B to start lapping of the front and back surfaces of the semiconductor wafer W. Note that the amount of material removed by lapping increases with the lapping time after the start of lapping.

Next, the stopping step of stopping lapping of the semiconductor wafer W (Step 5B of FIG. 5) is performed. For example, the rotation of the upper plate 10A and the lower plate 10B may be stopped when the supply of the solution containing abrasive grains is stopped in the same manner as in the stopping of lapping in the conventional lapping method. The time from the foregoing starting step (Step 5A of FIG. 5) to the stopping of lapping in this step (Step 5B of FIG. 5) can be determined arbitrarily, and the stopping step, reversing step, and resuming step of this embodiment are sequentially performed, thus the advantageous effects of this disclosure can be obtained.

In this embodiment, the reversing step is preferably performed when the amount of material removed by lapping (hereinafter also referred to as "lapping amount") is 40% or more and 60% or less with respect to a target lapping amount. Note that the "target lapping amount" here corresponds to the total amount of material to be removed by the lapping method of this embodiment. Here, the stopping step after the starting step is preferably performed when a lapping amount of 40% or more and 60% or less with respect to the target lapping amount is achieved, more preferably when a lapping amount of 45% or more and 55% or less with respect to the target lapping amount is achieved. In this manner, the reversing step immediately after the stopping step can be performed when a desired lapping amount is achieved. When the target lapping amount is controlled by lapping time, the stopping step may be performed after a lapse of 40% or more and 60% or less of the total lapping time, or the stopping step may be performed after a lapse of 45% or more and 55% or less of the total lapping time. Thus, as described with reference to FIGS. 3A to 4B, machining effects caused due to the shape of the upper plate 10A and the lower plate 10B, and the planetary motion of the semiconductor wafers W loaded on the carrier plates 20 can be reduced more reliably. Accordingly, in a state after lapping before performing polishing, a peak-to-valley (P-V) value of the wafer shape in the radial direction of the semiconductor wafer W can be 0.51 µm or less, or the P-V value can even be 0.26 µm or less. The P-V value of the wafer shape in the radial direction means the difference between the maximum value (peak) and the minimum value (valley) of the geometric profile of the semiconductor wafer W, which is obtained when the semiconductor wafer W is scanned from one end in the diameter direction to the other end.

After stopping lapping of the semiconductor wafer NV, the reversing step of reversing the surfaces of the semiconductor wafer W (surfaces Wa and Wb) facing the upper plate 10A and the lower plate 10B (Step 5C of FIG. 5) is performed as described above. This reversing step is described more specifically with reference to FIGS. 5A to 5C. As illustrated in FIGS. 5A and 5B, after starting lapping until stopping lapping, the surface of the semiconductor wafer W facing the upper plate 10A is the surface Wa, and the surface of the semiconductor wafer W facing the lower plate 10B is the surface Wb. In this step, the surface Wa and the surface Wb are reversed with respect to the upper plate 10A and the lower plate 10B. Accordingly, this step makes the surface of semiconductor wafer W facing the upper plate 10A the surface Wb and makes the surface of the semiconductor wafer W facing the lower plate 10B the surface Wa.

In this reversing step, the surfaces of the semiconductor wafer W facing the plates can be reversed by a given method. For example, the semiconductor wafer W loaded on the carrier plate 20 may be lifted using a known holding means such as a suction pad or a vacuum pad, the surfaces facing the plates may be reversed as described above, and the semiconductor wafer W may be reloaded on the carrier plate 20.

Finally, the resuming step of resuming lapping of the semiconductor wafer W while maintaining the reversal of the surfaces facing the plates (FIG. 5) is performed. In resuming lapping, lapping may be performed in the same manner as in the starting step. The lapping may be terminated after the total of the lapping amount after the resumption in this step and the lapping amount previously obtained through the starting step and the stopping step reaches a target lapping amount. Further, when the target lapping amount of material removed by lapping is controlled by lapping time, lapping may be terminated after a lapse of remaining time determined from the total lapping time after resuming lapping.

As described above, for the resultant semiconductor wafer W, effects of the pressing force due to the shape of the upper plate 10A and the lower plate 10B are reduced. Accordingly, machining effects of lapping on semiconductor wafer surfaces can be reduced. Further, when a polishing step is performed on a semiconductor wafer subjected to lapping of this embodiment, a ring-shaped pattern is prevented from being formed when a nanotopography map is obtained.

Note that the nanotopographies can be measured using a measurement system commercially available from KLA-Tencor Corporation, RAYTEX CORPORATION, ADE Corporation, etc. in accordance with SEMI Standards M43 and M78. Further, in measuring the nanotopographies, the polishing conditions for the polishing step performed after lapping can be typical conditions. Further, in measuring the nanotopographies, one or both of cleaning and etching of semiconductor wafer surfaces, and any other given steps may be performed between lapping and polishing. Moreover, in this embodiment, after the starting step, the stopping step, reversing step, and resuming step may be repeated in this order a plurality of times and lapping may be terminated after that. In this case, the timing with which lapping is terminated may be appropriately set depending on a target lapping amount.

Specific aspects of this embodiment will be described below; however, this disclosure is not limited to the specific examples described below.

The lapping method of this embodiment can be applied to any given semiconductor wafer W, and can be applied to a thin disk-shaped wafer obtained by slicing a single crystal ingot of for example silicon or a compound semiconductor such as GaAs using a wire saw. The lapping method of this embodiment is preferably applied to a silicon wafer for which excellent topography is required as the semiconductor wafer W.

Although the size of the semiconductor wafer W is not limited, the lapping method of this embodiment is preferably applied to a large diameter wafer. For example, the lapping method is preferably applied to a silicon wafer having a diameter of 300 mm or more, and more preferably applied to a silicon wafer having a diameter of 450 mm or more. Even for such a large diameter silicon wafer, a ring-shaped pattern can be prevented from being formed in a nanotopography map after polishing by applying the lapping method of this embodiment.

For the upper plate 10A, the lower plate 10B, and the carrier plates 20, ones typically used for lapping can be used. For a solution containing abrasive grains used for lapping, for example, a water-soluble solution obtained by mixing small particle free abrasive grains of alumina-zirconium etc. and a liquid such as water that contains a surfactant can be used.

Further, although examples using five carrier plates are illustrated in FIGS. 1 to 4B, the number of the carrier plates is not limited in particular. In FIGS. 1 to 4B, one semiconductor wafer W is loaded on one carrier plate; alternatively, a plurality of semiconductor wafers W may be loaded on one carrier plate.

In addition, a driving units such as a motor and control units which are not shown can of course be used.

(Semiconductor Wafer)

A semiconductor wafer according to this disclosure is a mirror polished semiconductor wafer, and neither of a ring-shaped recessed pattern nor a ring-shaped raised pattern is observed on a surface of the semiconductor wafer by nanotopography map evaluation. A semiconductor wafer according to this disclosure can be produced by the above embodiment of a lapping method, followed by mirror polishing using an ordinary method. For a semiconductor wafer according to conventional techniques, when nanotopography map evaluation is performed after mirror polishing, a ring-shaped recessed pattern or raised pattern is observed in a surface of the semiconductor wafer. However, using the lapping method of the above embodiment, a semiconductor wafer for which no ring-shaped pattern is observed by nanotopography map evaluation can be produced.

Further, in a cross section of a nanotopography map of a mirror polished semiconductor wafer, the difference between the average height of a surface center area of a semiconductor wafer and the average height of a surface peripheral area of the semiconductor wafer, which surrounds the surface center area is preferably 1 nm or less, in which case it is ensured that no ring pattern is observed. Here, the areas of the surface center area and the surface peripheral area are described more particularly by way of illustration. When the diameter of a semiconductor wafer is 450 mm (radius: 225 mm), a region extending 160 mm from the center of the semiconductor wafer is regarded as a surface center area, and a region of 160 mm to 200 mm from the center of the semiconductor wafer is regarded as a surface peripheral area of the semiconductor wafer.

Further, the semiconductor wafer preferably has a diameter of 300 mm or more, and more preferably has a diameter of 450 mm or more. Moreover, the semiconductor wafer is preferably a silicon wafer. Even in the case of a large diameter silicon wafer, a silicon wafer for which no ring-shaped pattern is observed by nanotopography map evaluation can be obtained using the lapping method of the above embodiment.

EXAMPLES

Next, in order to clarify the effects of this disclosure, examples are given below; however, this disclosure is not limited to those examples in any way.

Example 1

A silicon wafer with a diameter of 450 mm was lapped in accordance with the above-described structure of FIG. 1 and the process flow diagram presented in FIG. 5. Specifically, silicon wafers with a diameter of 450 mm obtained by slicing a single crystal silicon ingot were loaded on each carrier plates, and the carrier plates were placed between an upper plate and a lower plate of a lapping apparatus. The total lapping time through which a target lapping amount should be achieved was previously determined.

First, lapping on the silicon wafer was started, and the lapping was stopped after a lapse of 35% of the total lapping time. After stopping the lapping, the silicon wafer was removed from the carrier plate using a suction pad, the surfaces of the silicon wafer facing the upper plate and the lower plate were reversed, and the silicon wafer was loaded on the carrier plate. In other words, the reversing step was performed when the lapping amount was 35% with respect to the target lapping amount. Next, lapping was resumed, and the lapping was terminated after a lapse of remaining time determined from the total lapping time (i.e., 65% of the total lapping time).

Examples 2 to 5

Silicon wafers with a diameter of 450 mm were lapped in the same manner as in Example 1 except that the lapping time from the start of lapping until the lapping should be stopped was changed to 40%, 50%, 60%, and 65% of the total lapping time. Accordingly, in Examples 2 to 5, a reversing step was performed when the lapping amount reached 40%, 50%, 60%, and 65%, respectively, with respect to the target lapping amount.

Conventional Example 1

A silicon wafer with a diameter of 450 mm was lapped in the same manner as in Example 1 except that lapping was terminated after a lapse of the total lapping time without stopping the lapping. Accordingly, inversion of the silicon wafer and resumption of lapping were not performed in Conventional Example 1.

<Evaluation 1: Geometric Evaluation>

Silicon wafers subjected to lapping according to Examples 1 to 5 and Conventional Example 1 were subjected to alkali etching (hereinafter abbreviated as "alkali ET") under the same conditions. After that, graphs of the geographic profile in the radial direction of the silicon wafers (the direction indicated by the arrow in each nanotopography map, corresponding to a cross section in the wire running direction, which prevents the effects of undulations caused by slicing) were obtained using a capacitive profile measurement system (SBW-451/R manufactured by KOBELCO RESEARCH INSTITUTE, INC.). The results are presented in FIGS. 6 and 7. The P-V values of the geometric profiles are given in Table 1. In the graphs in FIGS. 6 and 7, the horizontal axis corresponds to the distance from the center of the wafer, and the height represents the relative values (a.u.). Note that the alkali ET is mainly aimed at cleaning the silicon wafers subjected to lapping, and does not affect the P-V values of the geometric profile of the silicon wafers subjected to measurements using the capacitive profile measurement system.

<Evaluation 2: Nanotopography Evaluation>

The silicon wafers subjected to the lapping of Examples 1 to 5 and Conventional Example 1 were subjected to alkali ET performed in Evaluation 1 above under the same conditions and then subjected to double-side polishing followed by mirror polishing under the same conditions. The silicon wafers subjected to mirror polishing were subjected to measurement using a nanotopography measurement system (WaferSight 3 manufactured by KLA-Tencor Corporation) to obtain nanotopography maps of the wafer surfaces. Further, the nanotopography profiles in the radial direction (the direction indicated by the arrow in each nanotopography map, corresponding to a cross section in the wire running direction, which prevents the effects of undulations caused by slicing) were obtained as well. The results are presented in FIGS. 6 and 7. In the graphs in FIGS. 6 and 7, the horizontal axis corresponds to the distance from the center of the wafer. The height difference in the nanotopography (NT) in the radial direction (the difference between the average height of a surface center area and the average height of a surface peripheral area) is given in Table 1. Here, the surface center area refers to a region extending 160 mm from the center of each silicon wafer, and the surface peripheral area is a region of 160 mm to 200 mm from the center of each semiconductor wafer.

TABLE 1

| | P-V value of geometric profile after alkali etching (μm) | Height difference of NT after polishing (nm) | Notes |
| --- | --- | --- | --- |
| Conventional Example 1 | 0.82 | 3.88 | No stopping and No reversing |
| Example 1 | 0.51 | 2.61 | Stopping and reversing after 35% of total lapping time |

TABLE 1-continued

|  | P-V value of geometric profile after alkali etching (μm) | Height difference of NT after polishing (nm) | Notes |
|---|---|---|---|
| Example 2 | 0.26 | 0.80 | Stopping and reversing after 40% of total lapping time |
| Example 3 | 0.19 | 0.39 | Stopping and reversing after 50% of total lapping time |
| Example 4 | 0.21 | 0.43 | Stopping and reversing after 60% of total lapping time |
| Example 5 | 0.34 | 1.92 | Stopping and reversing after 65% of total lapping time |

Figure 6:
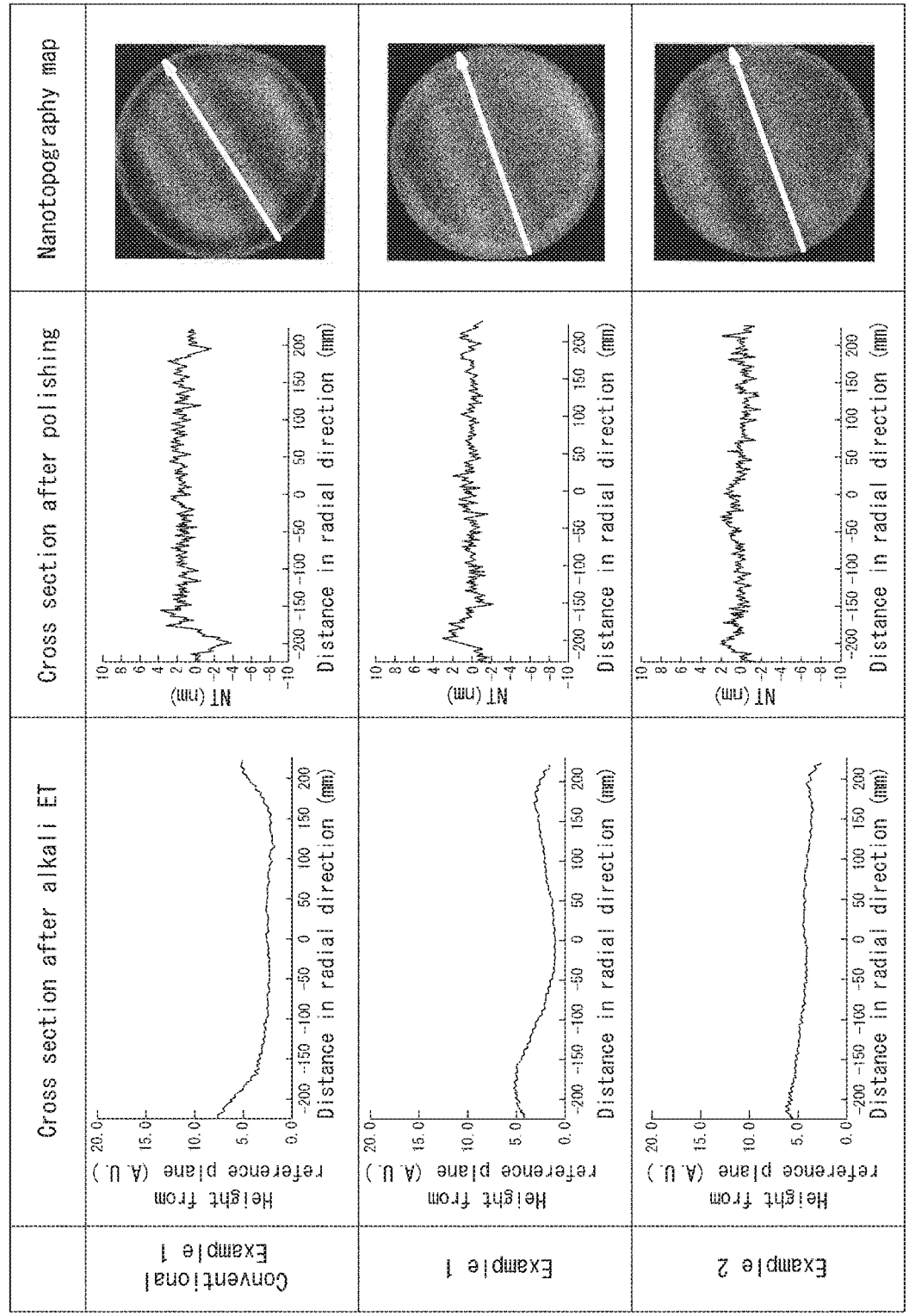
FIG. 6 presents graphs depicting the wafer geometric profile and the nanotopography profile, and nanotopography maps of Conventional Example 1, Examples 1 and 2 in EXAMPLES.
Figure 7:
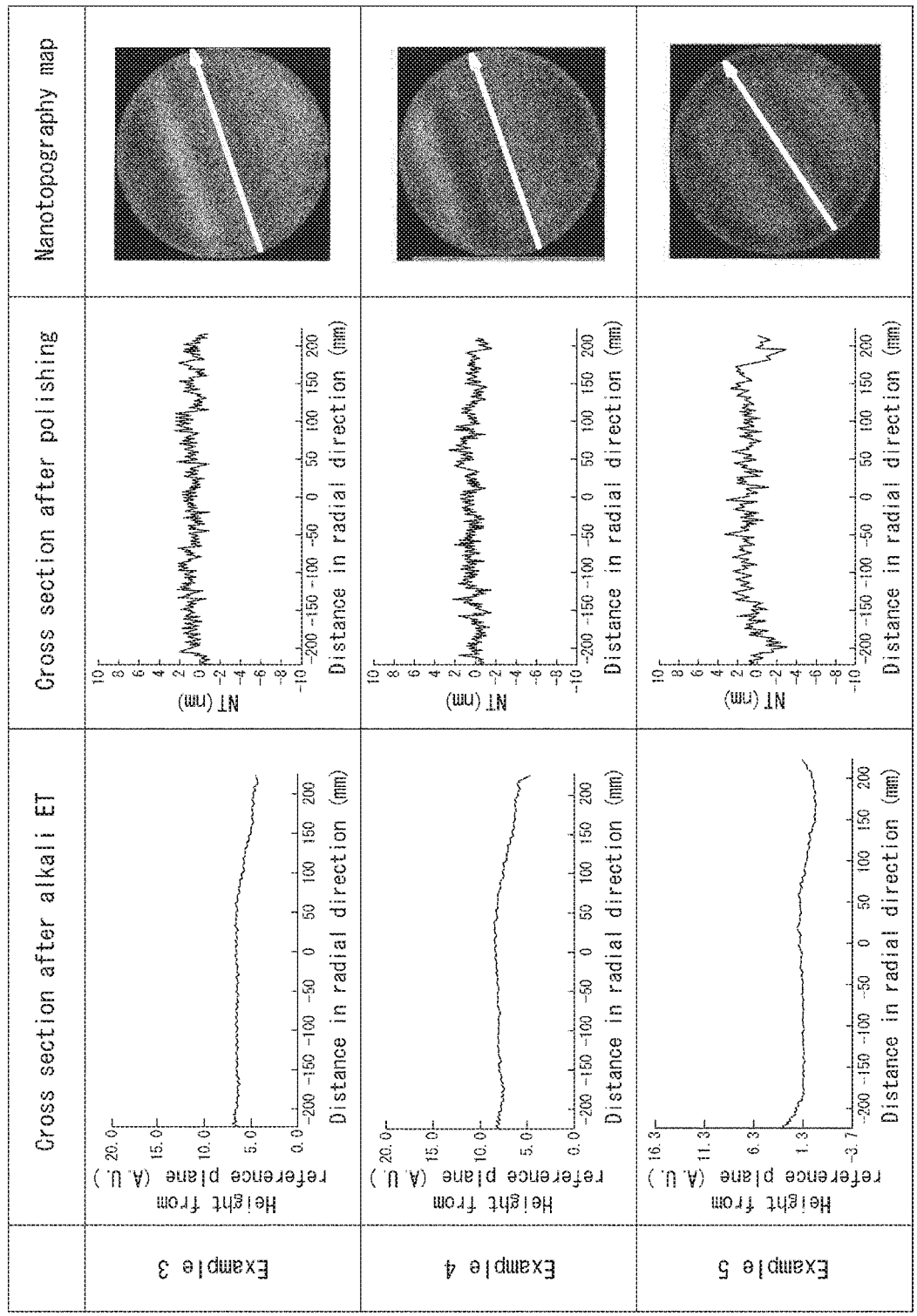
FIG. 7 presents graphs depicting the wafer geometric profile and the nanotopography profile, and nanotopography maps of Examples 3 to 5 in EXAMPLES.

FIGS. 6 and 7 indicate that the formation of a ring-shaped pattern in the nanotopography map was suppressed in Examples 1 to 5 as compared with Conventional Example 1. In particular, no ring-shaped pattern was observed by nanotopography map evaluation in Examples 2 to 4. Further, the formation of a ring-shaped pattern in the nanotopography map was confirmed to be more reliably suppressed when the P-V value of the geometric profile after alkali ET was 0.3 μm or less (specifically, 0.26 μm or less). In other words, it is ensured that no ring-shaped pattern is observed in the nanotopography map when the height difference of NT in the cross section after polishing is 1 nm or less (specifically, 0.80 nm or less).

INDUSTRIAL APPLICABILITY

This disclosure provides a method of lapping a semiconductor wafer, which can suppress the formation of a ring-shaped pattern in a nanotopography map, which is useful in the semiconductor industry.

REFERENCE SIGNS LIST

10A: Upper plate
10B: Lower plate
11: Sun gear
12: Internal gear
20: Carrier plate
W: Semiconductor wafer

The invention claimed is:

1. A method of lapping a semiconductor wafer, in which while a solution containing abrasive grains is supplied to a gap between an upper plate and an lower plate placed to face each other, a carrier plate on which a semiconductor wafer is loaded is made to perform a planetary motion, thereby lapping a front surface and a back surface of the semiconductor wafer directly in contact with the upper plate and the lower plate, the method comprising:

starting lapping of the semiconductor wafer by supplying the solution, wherein no polishing pad is present between the upper plate and the lower plate;
stopping lapping of the semiconductor wafer;
reversing surfaces of the semiconductor wafer facing the upper plate and the lower plate after the stopping; and
resuming lapping of the semiconductor wafer after the reversing while maintaining the reversal of the surfaces facing the upper plate and the lower plate.

2. The method of lapping a semiconductor wafer, according to claim 1, wherein the reversing is performed when a lapping amount is 40% or more and 60% or less with respect to a target lapping amount.

3. The method of lapping a semiconductor wafer, according to claim 1, wherein the semiconductor wafer is a silicon wafer.

4. The method of claim 1, wherein the solution including the abrasive grains comprises abrasive grains of alumina-zirconium and a surfactant.

5. A method of lapping a semiconductor wafer, in which a carrier plate on which a semiconductor wafer loaded between an upper plate and a lower plate is made to perform a planetary motion, the method comprising:

starting lapping of a front surface and a back surface of the semiconductor wafer by supplying a solution including abrasive grains to a gap between the upper plate and the lower plate, and the solution being in contact with both the front surface and the back surface during lapping;
stopping lapping of the semiconductor wafer;
reversing surfaces of the semiconductor wafer facing the upper plate and the lower plate after the stopping; and
resuming lapping of the semiconductor wafer after the reversing while maintaining the reversal of the surfaces facing the upper plate and the lower plate.

* * * * *